United States Patent
Eggs et al.

(10) Patent No.: US 7,805,820 B2
(45) Date of Patent: Oct. 5, 2010

(54) METHOD OF PRODUCING A THIN-FILM RESONATOR

(75) Inventors: Christoph Eggs, Rattenkirchen (DE); Ansgar Schäufele, München (DE); Martin Woelky, Holzkirchen (DE)

(73) Assignee: Epcos AG (DE)

( * ) Notice: Subject to any disclaimer, the term of this patent is extended or adjusted under 35 U.S.C. 154(b) by 622 days.

(21) Appl. No.: 11/301,564

(22) Filed: Dec. 13, 2005

(65) Prior Publication Data

US 2006/0170308 A1    Aug. 3, 2006

(30) Foreign Application Priority Data

Dec. 13, 2004    (DE) ........................ 10 2004 059 965

(51) Int. Cl.
*H04R 17/10* (2006.01)
*B44C 1/22* (2006.01)

(52) U.S. Cl. .................... 29/25.35; 29/831; 29/846; 216/41; 216/47; 438/717; 310/313 R; 310/321

(58) Field of Classification Search .............. 29/25.35, 29/594, 831, 846; 216/40, 41, 47; 438/717; 310/311, 313 R, 320, 321, 367, 328, 324, 310/331; 252/62.9 R
See application file for complete search history.

(56) References Cited

U.S. PATENT DOCUMENTS

| 4,019,200 | A | * | 4/1977 | Adkins et al. | ........ 310/313 R X |
| 4,519,872 | A | * | 5/1985 | Anderson et al. | ......... 216/40 X |
| 5,185,589 | A | * | 2/1993 | Krishnaswamy et al. | 310/320 X |
| 5,270,263 | A | * | 12/1993 | Kim et al. | ............... 438/717 X |
| 5,277,749 | A | * | 1/1994 | Griffith et al. | ................. 216/40 |
| 5,762,816 | A | * | 6/1998 | Kimura et al. | .......... 252/62.9 R |
| 6,256,849 | B1 | * | 7/2001 | Kim | ......................... 29/25.35 |
| 2003/0048041 | A1 | * | 3/2003 | Kita et al. | ................... 310/328 |

FOREIGN PATENT DOCUMENTS

JP    2003179518 A    *    6/2003
WO    01/06647 A1        1/2001

* cited by examiner

*Primary Examiner*—A. Dexter Tugbang
(74) *Attorney, Agent, or Firm*—Mayback & Hoffman, P.A.; Gregory L. Mayback; Rebecca A. Tie

(57) ABSTRACT

A thin-film resonator and a method for producing a thin-film component includes, for the purpose of structuring an upper first dielectric layer, a mask that comprises a second dielectric layer facing the upper dielectric layer and a photoresist layer. Initially, the photoresist layer that serves as photomask during the structuring of the second dielectric layer is structured. The structures of the second dielectric layer, together with the structures of the photoresist layer located thereabove, form a mask that is used for structuring the first dielectric layer.

9 Claims, 2 Drawing Sheets

METHOD OF PRODUCING A THIN-FILM RESONATOR

CROSS-REFERENCE TO RELATED APPLICATION

This application claims the priority, under 35 U.S.C. §119, of German patent application No. 10 2004 059 965.3, filed Dec. 13, 2004; the prior application is herewith incorporated by reference in its entirety.

BACKGROUND OF THE INVENTION

Field of the Invention

The invention pertains to a thin-film resonator operating with acoustical bulk waves and to a method for producing a multi-layer component, in particular, a thin-wall resonator or a capacitor.

A thin-film resonator is disclosed, for example, from the document International publication WO 01/06647 A1, corresponding to U.S. Pat. Nos. 6,788,170 and 6,812,619 to Kaitila et al.

SUMMARY OF THE INVENTION

It is accordingly an object of the invention to provide a thin-film resonator and method for producing a multi-layer component that overcome the hereinafore-mentioned disadvantages of the heretofore-known devices and methods of this general type and that has improved electrical characteristics.

With the foregoing and other objects in view, there is provided, in accordance with the invention, a thin-film resonator operating with acoustical bulk waves, including a piezoelectric layer having chemically etched lateral face and a top surface and a structured mask layer being disposed above the piezoelectric layer on the top surface of the piezoelectric layer, the mask layer being of a material resistant to an etching material that etches the piezoelectric layer.

With the objects of the invention in view, there is also provided a thin-film resonator operating with acoustical bulk waves, including a piezoelectric layer having a chemically etched lateral face, a top surface, and an acoustically active resonator region with an edge, a structured mask layer being disposed above the piezoelectric layer on the top surface, the mask layer being of a material resistant to an etching material that etches the piezoelectric layer and extending along the edge of the acoustically active resonator region to, thereby, form a frame, and a metal layer covering the piezoelectric layer and at least partly covering the frame.

With the objects of the invention in view, there is also provided a thin layer resonator operating with acoustical bulk waves, including an etched structured piezoelectric layer having a top side with a top side edge region, the piezoelectric layer being unetched at the top side edge.

In accordance with an added feature of the invention, the piezoelectric layer has a surface and a structured mask layer of a material resistant to etching measures that etch the piezoelectric layer is disposed above the piezoelectric layer at the surface.

What is disclosed is a thin-film resonator working with acoustical bulk waves having two electrodes located on top of one another and a chemically etched piezoelectric layer located therebetween. The piezoelectric layer is only slightly under-etched, whereby the length of the under-etched region is smaller than the layer thickness of this layer. This is achieved by using a multi-layer mask that has layer that is resistant to measures of etching below a photoresist layer.

In accordance with another feature of the invention, the piezoelectric layer has an interface to the mask layer and the piezoelectric layer is unetched at the interface to the mask layer.

Contrary to the etching of a piezoelectric layer with only the help of a photomask, the configuration of the present invention has the advantage that the penetration of the etching at the interface between the common photomask and this layer and the under-etching of the latter is substantially prevented. This prevents the development of inaccurate etching edges of the piezoelectric layer, which can impair the electrical characteristics of the component, particularly when applying further layers.

Preferably, a structured mask layer of a material resistant to the etching measures that etch the piezoelectric layer located therebelow is disposed on the surface of the piezoelectric layer. The piezoelectric layer is under-etched only slightly, whereby the length of the under-etched region is smaller than the layer thickness of the piezoelectric layer. For example, the mask layer is of a Si-containing material, such as silicon oxide. Such a mask layer, preferably, is produced from a tetra-ethyl-ortho-silicate (TEOS) layer.

In accordance with a further feature of the invention, the piezoelectric layer has an acoustically active resonator region with an edge, the mask layer extends along the edge of the acoustically active resonator region to, thereby, form a frame, and a metal layer covers the piezoelectric layer and at least partly covers the frame.

Preferably, the mask layer is structured in a subsequent process for forming a frame surrounding an active acoustical resonator region. The frame is disposed in the edge region of the resonator and, in an advantageous variant, serves for adapting the profile of an acoustic mode to the so-called "piston mode." In a preferred variant, the piezoelectric layer or its region enclosed by the frame is covered with a metal layer that covers the frame at least partly.

Preferably, the thin-film resonator is disposed on a carrier substrate—in a variant, above a cavity embodied therein. In a further variant, an acoustic mirror is disposed between the carrier substrate and the resonator.

With the objects of the invention in view, there is also provided a method for producing a multi-layer component, including the steps of (A) providing a multi-layer system with an uppermost layer formed by a first dielectric layer, (B) applying a Si-containing second dielectric layer onto the first dielectric layer and a photoresist layer onto the second dielectric layer, (C) structuring the photoresist layer to form a first mask, (D) structuring the second dielectric layer with aid of the first mask, whereby structures of the second dielectric layer together with structures of the first mask located thereabove form a second mask, (E) structuring the first dielectric layer with aid of the second mask, and (F) removing the photoresist layer.

What is disclosed is a method for producing a multi-layer component, where a multi-layer mask having a structured second dielectric layer borders on the first dielectric layer and a photoresist layer for structuring a first dielectric layer is located on top—preferably, a piezoelectric layer, and, in particular, a layer of AlN.

Preferably, the multi-layer component is a thin-film component. The first dielectric layer represents the uppermost layer of a multi-layer stack onto which the second dielectric layer is applied. The second dielectric layer is a Si-containing, preferably, inorganic layer that contains Si—O-connections. The second dielectric layer is not a photoresist layer. Instead, it is chosen from a point of view to have the highest possible etching selectivity as compared to the first dielectric layer. At least one photoresist layer is applied onto the second dielectric layer.

Initially, for forming a mask, the photoresist layer applied onto the second dielectric layer is structured, for example, by exposing and developing. This mask serves as a photomask during the structuring of the second dielectric layer. The structures of the second dielectric layer, together with structures of the photoresist layer located thereabove, form a multi-layer hard mask that, according to the invention, is used for structuring the first dielectric layer.

In accordance with an additional mode of the invention, a piezoelectric layer is provided as the first dielectric layer.

In accordance with yet another mode of the invention, the bottom layer of the second mask is allowed to remain on the multi-layer system and the bottom layer of the second mask is utilized as a functional layer of the multi-layer system.

In accordance with yet a further mode of the invention, the structuring step is carried out by structuring the piezoelectric layer into thin-film resonators.

In accordance with yet an added mode of the invention, the photoresist is removed after the structuring of the first dielectric layer. In a variant, the second dielectric layer is further structured, e.g., for forming dielectric edge structures of the thin layer resonators. Above the first dielectric layer with the edge structures formed thereon, a structured metal layer is produced in which, preferably, upper electrodes of the component structures are formed. The upper electrodes each cover the exposed regions of the first dielectric layer surrounded by the edge structures and, at least partly, the edge structures of the second dielectric layer.

In accordance with yet an additional mode of the invention, after carrying out the photoresist removing step F) to expose the first dielectric layer, the second dielectric layer is completely removed and upper electrodes are produced above the exposed first dielectric layer.

In accordance with again another mode of the invention, the second dielectric layer is completely removed after the structuring of the first dielectric layer. A metal layer structured for forming upper electrodes is applied on the exposed first dielectric layer.

In accordance with again a further mode of the invention, initially, the metal layer can be applied to the entire surface and, subsequently, be structured by etching with the use of a photomask. Preferably, the metal layer is produced by a physical vapor deposition (PVD) method.

In accordance with again an added mode of the invention, the first and/or the second dielectric layer can be applied, for example, by sputtering or can be grown by deposition, particularly, by a CVD method. Preferably, the first and/or the second dielectric layer are structured by wet-etching with the use of the multi-layer hard mask. As an alternative to wet-etching, a dry-etching of this layer is also possible.

In accordance with again an additional mode of the invention, preferably, a layer of silicon oxide is produced as second dielectric layer, e.g., by chemical vapor deposition of tetra-ethyl-ortho-silicate (TEOS). The use of the combination of silicon oxide and a photoresist as a hard mask is particularly advantageous for the etching in the region of the height differences (stages) of the first dielectric layer. A through-etching of the hard mask is avoided.

In accordance with still another mode of the invention, alternatively, a layer of a different material suitable for producing a hard mask, e.g., silicon nitride or silicon carbide, can be used as second dielectric layer.

In accordance with a concomitant mode of the invention, the first dielectric layer is provided as a layer of aluminum nitride.

Other features that are considered as characteristic for the invention are set forth in the appended claims.

Although the invention is illustrated and described herein as embodied in a thin-film resonator and method for producing a multi-layer component, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1A:
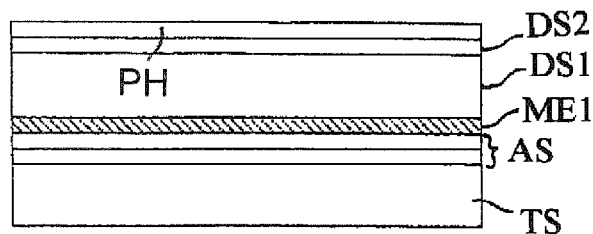
FIG. 1A is a fragmentary, cross-sectional view of stack according to the invention in a method step during structuring of the first dielectric layer by a multi-layer hard mask.

Referring now to the figures of the drawings in detail and first, particularly to FIG. 1A thereof, there is shown a thin-film stack disposed on a carrier substrate TS, the stack having, in the indicated sequence from bottom to top, a multi-layer acoustic mirror AS, a first metal layer ME1, a first dielectric layer DS1, a second dielectric layer DS2, and a photoresist layer PH.

Figure 1B:
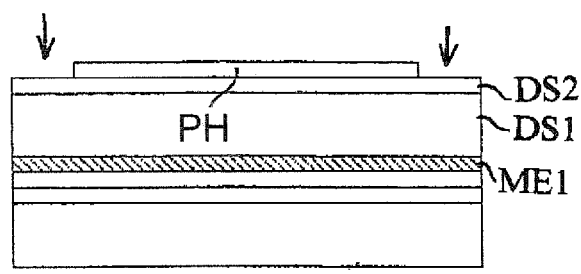
FIG. 1B is a fragmentary, cross-sectional view of stack according to the invention in another method step during structuring of the first dielectric layer by a multi-layer hard mask.

The photoresist layer PH is structured by exposing and developing (FIG. 1B) and is used as photomask during the etching of the second dielectric layer DS2. This produces a hard mask with two similarly structured layers located on top of one another.

Figure 1C:
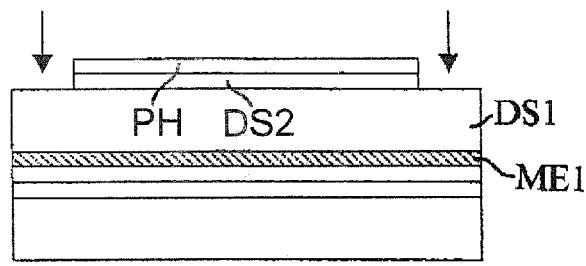
FIG. 1C is a fragmentary, cross-sectional view of stack according to the invention in a further method step during structuring of the first dielectric layer by a multi-layer hard mask.

Subsequently, the first dielectric layer DS1 is etched (FIG. 1C). During the etching of the first dielectric layer DS1, the structures of the second dielectric layer DS2, particularly, prevent the edge regions of this dielectric layer DS1 located below the hard mask from being under-etched.

Figure 1D:
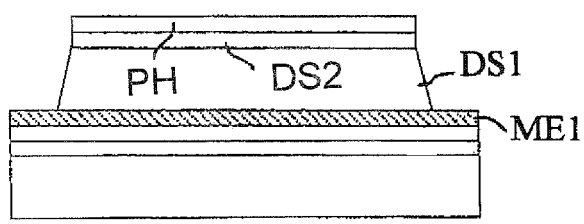
FIG. 1D is a fragmentary, cross-sectional view of stack according to the invention in yet another a method step during structuring of the first dielectric layer by a multi-layer hard mask.
Figure 1E:
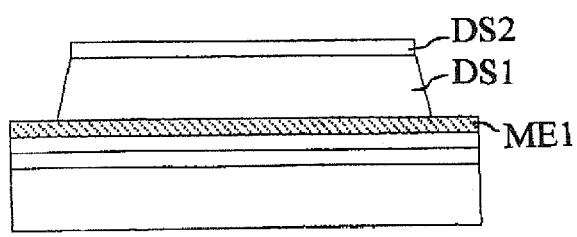
FIG. 1E is a fragmentary, cross-sectional view of stack according to the invention in still another a method step during structuring of the first dielectric layer by a multi-layer hard mask.

FIG. 1D shows the thin-film stack after the structuring of the first dielectric layer DS1 and FIG. 1E shows the stack after removal of the photoresist layer PH.

Figure 1F:
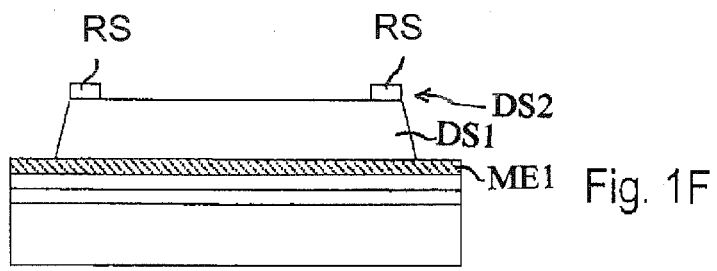
FIG. 1F is a fragmentary, cross-sectional view of stack according to the invention in a method step for producing a thin-film resonator with an acoustically dampening edge region where the lower layer of the hard mask is further structured and used as a functional layer of the component.
Figure 1G:
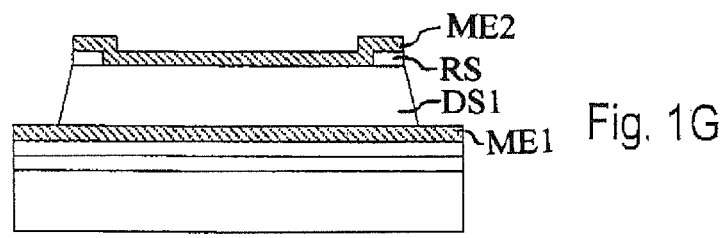
FIG. 1G is a fragmentary, cross-sectional view of stack according to the invention in a further method step for producing the thin-film resonator of FIG. 1F.

FIGS. 1F and 1G introduce a variant of the method according to the invention for generating a thin-film resonator with an acoustically dampening edge region, where the lower layer of the hard mask—the second dielectric layer DS2—is further structured to a functional layer of the component for the generation of edge structures RS (FIG. 1F).

A resonator is formed by the electrodes embodied in the metal layers ME1, ME2 and by a piezoelectric layer located therebetween (here, the structured first dielectric layer DS1). Each resonator has an active resonator region in which a bulk wave can be excited. The edge structures RS surround the respective active resonator region (preferably, from all sides) and each define a lateral edge region of the resonator in which the acoustical wave is dampened.

The second dielectric layer DS2 can be structured to these edge structures RS, for example, by using a further photomask not shown in FIG. 1F. Thereafter, a second metal layer structured into electrodes is applied.

The metal layers ME1, ME2 can each be, for example, of AlCu or another metal (or metal alloy), or of a layer sequence of electrically conducting layers.

Figure 2A:
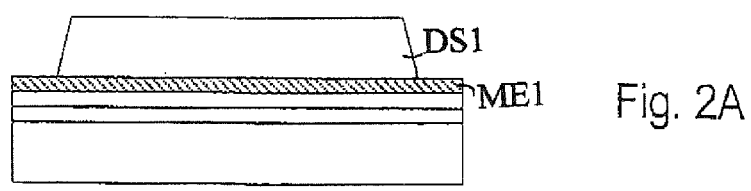
FIG. 2A is a fragmentary, cross-sectional view of stack according to the invention in a method step for producing a thin-film resonator with an acoustically dampening edge region, whereby the hard mask is completely removed after the structuring of the first dielectric layer.
Figure 2B:
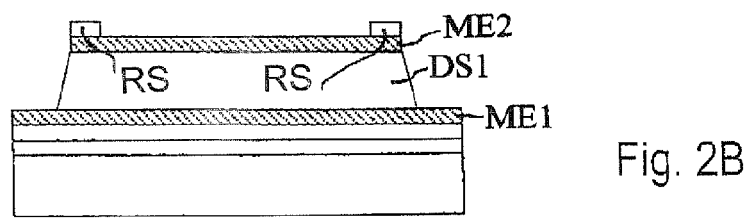
FIG. 2B is a fragmentary, cross-sectional view of stack according to the invention in another method step for producing the thin-film resonator of FIG. 2A.

FIGS. 2A and 2B show a further variant of the method for producing a thin-film resonator with an acoustically dampening edge region. Here, the hard mask or the second dielectric layer DS2, respectively, are, preferably, completely removed after the structuring of the first dielectric layer DS1 (FIG. 2A). A second metal layer ME2 is applied on the exposed surface of the structured first dielectric layer which is provided for defining a resonator region. A circumferential edge structure RS is applied on the second metal layer ME2 in the edge region.

The invention is not limited to the variants shown in the figures. Any materials, particularly those that can be structured by wet-etching, can be used for the dielectric layers. Particularly any piezoelectric materials can be used for producing the first dielectric layer.

We claim:

1. A method for producing a multi-layer component, which comprises:
   A) providing a multi-layer system with an uppermost layer formed by a first dielectric layer;
   B) applying a Si-containing second dielectric layer directly onto and in contact with the first dielectric layer and a photoresist layer onto the second dielectric layer;
   C) structuring the photoresist layer to form a first mask;
   D) structuring the second dielectric layer with aid of the first mask, whereby structures of the second dielectric layer together with structures of the first mask located there above form a second mask;
   E) structuring the first dielectric layer with aid of the second mask;
   F) removing the photoresist layer;
   G) permitting the second dielectric layer of the second mask to remain on the multi-layer system; and
   H) utilizing the second dielectric layer of the second mask as a functional layer of the multi-layer system.

2. The method according to claim 1, which further comprises providing a piezoelectric layer as the first dielectric layer.

3. The method according to claim 2, which further comprises carrying out the structuring step E) by structuring the piezoelectric layer into thin-film resonators.

4. The method according to claim 3, which further comprises: after step F):
   structuring the second dielectric layer further to form lateral edge structures each surrounding an exposed edge region of the first dielectric layer of one of the thin-film resonators; and
   producing upper electrodes that each cover the exposed edge region and at least partly cover the edge structures.

5. The method according to claim 1, which further comprises wet-etching at least one of the first dielectric layer and the second dielectric layer.

6. The method according to claim 1, which further comprises carrying out the production of the second dielectric layer by chemically vapor depositing tetra-ethyl-ortho-silicate to produce a layer of silicon oxide as the second dielectric layer.

7. The method according to claim 1, which further comprises providing the second dielectric layer as a layer of one of silicon nitride and silicon carbide.

8. The method according to claim 1, which further comprises providing the first dielectric layer as a layer of aluminum nitride.

9. A method for producing a multi-layer component, which comprises:
   A) providing a multi-layer system with an uppermost layer formed by a first dielectric layer;
   B) applying a Si-containing second dielectric layer onto the first dielectric layer and a photoresist layer onto the second dielectric layer;
   C) structuring the photoresist layer to form a first mask;
   D) structuring the second dielectric layer with aid of the first mask, whereby structures of the second dielectric layer together with structures of the first mask located there above form a second mask;
   E) structuring the first dielectric layer with aid of the second mask;
   F) removing the photoresist layer;
   G) permitting the second dielectric layer of the second mask to remain on the multi-layer system; and
   H) utilizing the second dielectric layer of the second mask as a functional layer of the multi-layer system,
   and further comprises: after carrying out the photoresist removing step F) to expose the first dielectric layer, completely removing the second dielectric layer and producing upper electrodes above the exposed first dielectric layer.

* * * * *